United States Patent
Kim et al.

(10) Patent No.: US 10,347,520 B2
(45) Date of Patent: Jul. 9, 2019

(54) ELECTROSTATIC CHUCK AND METHOD FOR MANUFACTURING ELECTROSTATIC CHUCK

(71) Applicants: FEMVIX CORP., Yongin-si, Gyeonggi-do (KR); Ok Ryul Kim, Yongin-si, Gyeonggi-do (KR); Ok Min Kim, Yongin-si, Gyeonggi-do (KR)

(72) Inventors: Ok Ryul Kim, Yongin-si (KR); Ok Min Kim, Yongin-si (KR)

(73) Assignees: FEMVIX, Gyeonggi-do (KR); Ok Ryul Kim, Gyeonggi-do (KR); Ok Min Kim, Gyeonggi-do (KR)

(*) Notice: Subject to any disclaimer, the term of this patent is extended or adjusted under 35 U.S.C. 154(b) by 505 days.

(21) Appl. No.: 15/021,897

(22) PCT Filed: Sep. 4, 2014

(86) PCT No.: PCT/KR2014/008316
§ 371 (c)(1),
(2) Date: Mar. 14, 2016

(87) PCT Pub. No.: WO2015/037872
PCT Pub. Date: Mar. 19, 2015

(65) Prior Publication Data
US 2016/0233121 A1 Aug. 11, 2016

(30) Foreign Application Priority Data
Sep. 16, 2013 (KR) .................... 10-2013-0110964

(51) Int. Cl.
*H01L 21/683* (2006.01)
*B05D 3/04* (2006.01)
(Continued)

(52) U.S. Cl.
CPC ............ *H01L 21/6833* (2013.01); *B05D 1/02* (2013.01); *B05D 3/0493* (2013.01); *H02N 13/00* (2013.01); *H01L 21/6831* (2013.01)

(58) Field of Classification Search
CPC ... H01L 21/6833; H01L 21/6831; B05D 1/02; B05D 3/0493; H02N 13/00
(Continued)

(56) References Cited

U.S. PATENT DOCUMENTS 7,153,567 B1   12/2006   Akedo et al.
7,993,701 B2   8/2011    Akedo et al.
(Continued)

FOREIGN PATENT DOCUMENTS

KR   10-0483260 B1   4/2005
KR   10-0571158 B1   4/2006
(Continued)

*Primary Examiner* — Zeev V Kitov
(74) *Attorney, Agent, or Firm* — Novick, Kim & Lee, PLLC; Sang Ho Lee

(57) ABSTRACT

Provided is an electrostatic chuck including: a base material; an adsorption unit for adsorbing a wafer by using electrostatic force; an adhesive layer for adhering the adsorption unit to the base material; and an adhesive layer anti-corrosion coating layer provided to cover an exposed surface of the adhesive layer, wherein the adhesive layer anti-corrosion coating layer has no pores or cracks since the adhesive layer anti-corrosion coating layer is made by a method of spraying and coating, at conditions of 0-50° C. and a vacuum state, ceramic powder which is continuously supplied at a constant quantity to the carrier gas of which a fixed flow rate is controlled, and a method for manufacturing an electrostatic chuck, including the steps of: (a) forming an adhesive layer for adhering an adsorption unit for adsorbing a wafer to a base material by using electrostatic force; and (b) forming an adhesive layer anti-corrosion coating layer which covers an exposed surface of the adhesive layer and has no pores or (Continued)

cracks as it is made by a method of spraying and coating, at conditions of 0-50° C. and a vacuum state, ceramic powder which is continuously supplied at a constant quantity to the carrier gas of which a fixed flow rate is controlled.

15 Claims, 5 Drawing Sheets

(51) Int. Cl.
  *B05D 1/02* (2006.01)
  *H02N 13/00* (2006.01)
(58) Field of Classification Search
  USPC .......................................................... 361/234
  See application file for complete search history.

(56) References Cited

U.S. PATENT DOCUMENTS

| | | | |
|---|---|---|---|
| 8,241,703 B2 * | 8/2012 | Hatono | B05D 1/12 |
| | | | 427/201 |
| 8,252,132 B2 | 8/2012 | Yoshioka et al. | |
| 9,666,466 B2 * | 5/2017 | Parkhe | H01L 21/67103 |
| 2006/0102613 A1 * | 5/2006 | Kuibira | H01L 21/67103 |
| | | | 219/444.1 |
| 2006/0175772 A1 * | 8/2006 | Nozawa | H01L 21/6833 |
| | | | 279/128 |
| 2008/0276865 A1 | 11/2008 | Nishimizu et al. | |

FOREIGN PATENT DOCUMENTS

| | | | |
|---|---|---|---|
| KR | 10-0916944 B1 | 9/2009 | |
| KR | 10-0997374 B1 | 11/2010 | |

\* cited by examiner

ELECTROSTATIC CHUCK AND METHOD FOR MANUFACTURING ELECTROSTATIC CHUCK

TECHNICAL FIELD

The present invention relates to an electrostatic chuck for fixing a wafer using electrostatic force in a semiconductor manufacturing process and a method of manufacturing the same, and more specifically, to an electrostatic chuck and a method of manufacturing the same, in which the electrostatic chuck is configured to include an coating layer for preventing erosion of an adhesive layer which adheres an adsorption unit performing a function of fixing a wafer to the base substrate of the electrostatic chuck.

BACKGROUND ART

An electrostatic chuck is a device for adsorbing and fixing a wafer in a semiconductor manufacturing process, which is used in the process of deposition, etching, diffusion or the like.

An adsorption unit of an electrostatic chuck, which is a component for directly fixing a wafer in a plasma environment of a semiconductor manufacturing process, is mostly composed of a ceramic sheet or an insulating resin sheet having an anti-plasma characteristic. In addition, since the electrostatic chuck is an expensive device, it is generally reused after refurbishment to extend the lifespan, and, specifically, it is reproduced in a method of replacing the ceramic sheet or the insulating resin sheet of the adsorption unit with a new one.

In the case of a conventional electrostatic chuck, since an adhesive layer, which adheres the adsorption unit to a base substrate, is continuously exposed to plasma in a semiconductor manufacturing process, erosion occurs in the adhesive layer, and the adhesive layer is peeled off and it becomes a cause of particles in the process. And they result in wafer contamination and also the adsorbed wafer could be bent when a temperature difference occurs between the center and the periphery of the ceramic sheet or the insulating resin sheet of the adsorption unit.

As a prior art for preventing the conventional problem of separating an adhesive layer caused by plasma erosion on the adhesive layer and generating particles according thereto, a US patent entitled "Method And Apparatus For Repairing An Electrostatic Chuck Device, And The Electrostatic Chuck Device" (U.S. Pat. No. 8,252,132) has been publicized. The prior art prevents an adhesive layer from being exposed to plasma by winding a string-like adhesive around the adhesive layer formed between the base substrate and the adsorption unit using a bobbin device as shown in FIG. 1 of the patent specification.

However, since the prior art uses acrylic rubber and thermosetting resin, which are materials the same as those of the adhesive layer, as an adhesive, the adhesive is also not strong enough to have high resistance to the plasma and greatly affected by temperature, and, as a result, the prior art has a problem in that the adhesive is also separated by the plasma erosion and created as particles.

On the other hand, although a method of forming an erosion prevention coating layer by directly spraying ceramic powder on an exposed surface of the adhesive layer can be considered as a method for preventing the adhesive layer from being eroded in the plasma environment, it has problems described below.

First, when ceramic powder is sprayed on the exposed surface of the adhesive layer formed of resin for attaching the base substrate of the electrostatic chuck and the ceramic sheet using a thermal spraying method of spraying and coating ceramic powder by melting the ceramic powder at a temperature of 15,000K or higher or a cold spraying method of spraying and coating ceramic powder by heating the ceramic powder at a temperature of several hundred degrees Celsius, it is difficult to form a coating layer for protecting the adhesive layer since there is a problem of melting down the adhesive layer.

Second, although a chemical vapor deposition (CVD) method or a physical vapor deposition (PVD) method can be considered, since the two methods are appropriate for forming a thin film of 1 μm or less, it is difficult to apply the methods to forming a coating layer for protecting an exposed surface of the adhesive layer on the side surface of an electrostatic chuck placed in a plasma environment. Because a crack may occur in the coating layer if its thickness is 2 μm or above. In addition, although it is easy to form a coating layer on a plane using the coating methods, there is a disadvantage in that those coating methods have a difficulty in forming a coating layer uniformly on an exposed surface of an adhesive layer along the three-dimensional shape of the electrostatic chuck.

Third, there is another aerosol deposition (AD) method known as a method of spraying and coating ceramic powder in a vacuum state. Since by this method, spraying and coating the ceramic powder is possible at room temperature unlike the thermal spraying and cold spraying methods described above, the coating can be performed on the electrostatic chuck while the adhesive layer formed of resin is not melted. However, since the AD method uses a method of supplying aerosolized powder to a transfer tube which essentially needs an aerosol generator supplying and aerosolizing compressed gas and ceramic powder, like reference numeral 23 of FIG. 3 shown in the specification of U.S. Pat. No. 7,153,567 entitled "Composite Structure And Method And Apparatus For Forming The Same" (PCT/JP00/07076) and reference numeral 13 of FIG. 1 shown in the specification of U.S. Pat. No. 7,993,701 entitled "Composite Structure Forming Method", it is disadvantageous in that a constant amount of scattered powder cannot be supplied to the transfer tube since the powder is irregularly scattered by the compressed gas, and it is difficult to make a coating film having a uniform thickness along the three-dimensional shape of curved surfaces, holes and protruded portions since the amount of powder cannot be controlled constantly.

In order to improve the disadvantage of the AD method incapable of providing a constant amount of powder to the transfer tube, an improved method of installing a constant supply mechanism of reference numeral 2 in the front stage of an aerosolation mechanism of reference numeral 4 of FIG. 16 of the specification, accommodating and aerosolizing prepared particles in an accommodation mechanism, and supplying the particles to a transfer tube has been proposed, as is described in the specification of U.S. Pat. No. 8,241,703 entitled "Pre-Formed Controlled Particle Formed Of Fine Particles Non-Chemically Bonded Together, Composite Structure Formation Method Involving Controlled Particles, And Composite Structure Formation System Involving Controlled Particle". However, although a constant amount of powder is initially supplied from the accommodation mechanism containing the prepared particles and the constant supply mechanism themselves as shown in FIGS. 21 to 30 accompanied in the patent specification, the powder is supplied to the aerosol generator as shown in FIG. 16 of the specification in the same manner as shown in the U.S. Pat. Nos. 7,153,567 and 7,993,701, and the powder reaches a state of being transferred to the transfer tube irregularly and inconstantly in the end. That is, since the aerosol generator and the accommodation mechanism containing the powder are put into a vacuum state and the powder irregularly flows into the transfer tube when an AD coating apparatus operates, it is difficult to supply a constant amount of powder to the transfer tube.

On the other hand, the technique of U.S. Pat. No. 2008/0276865 entitled "Electrostatic Chuck, Manufacturing Method Thereof And Substrate Treating Apparatus" relates to a technique of forming a polycrystalline structure by spraying and coating yttria ($Y_2O_3$) powder on the adsorption surface (mounting surface) of an electrostatic chuck, which adsorbs and fixes a wafer, using the AD method. However, protrusions contacting with the bottom of the wafer exist on the adsorption surface of the electrostatic chuck, and the problem is that since the amount of powder supplied to the transfer tube from the aerosol generator cannot be constantly controlled by the nature of the system, thickness of the coating film on the protrusions and surrounding areas is non-uniform across the adsorption surface of the electrostatic chuck, and thus line patterns having a predetermined width are generated on the adsorption surface after AD coating is actually performed, and, therefore, it may negatively affect the electrical characteristics of the electrostatic chuck. Furthermore, due to the shape of the electrostatic chuck adsorbing a 200 or 300 mm wafer, it is difficult to form an erosion prevention coating layer on an exposed surface of the circular outer adhesive layer using the AD method. It is since that the powder is unevenly supplied to the transfer tube from the aerosol generator (aerosolation mechanism) by the nature of the system since this method is performed using an AD coating apparatus, and thus it is difficult to transfer a constant amount of powder to a spray nozzle. Accordingly, if coating is performed along the circular exposed adhesive layer, a phenomenon of separating the ceramic coating film from the exposed surface of the adhesive layer occurs, and thus the erosion prevention coating layer cannot be formed on the surface of the adhesive layer.

In conclusion, an adhesive layer erosion prevention coating layer capable of protecting an exposed surface of an adhesive layer, which adheres an adsorption unit adsorbing and fixing a wafer to a base substrate, from a plasma environment and not being peeled off from the exposed surface of the adhesive layer, is needed.

DISCLOSURE OF INVENTION

Technical Problem

Therefore, the present invention has been made in view of the above problems, and it is an object of the present invention to provide an electrostatic chuck having an improved lifespan and a method of manufacturing the same, in which the electrostatic chuck is used in a semiconductor manufacturing process and is configured to protect an adhesive layer adhering a base substrate and an adsorption unit from plasma to prevent erosion of the adhesive layer and generation of particles.

Technical Solution

To accomplish the above object, according to one aspect of the present invention, there is provided an electrostatic chuck including: a base substrate; an adsorption unit for adsorbing a wafer using electrostatic force; an adhesive layer for adhering the adsorption unit to the base substrate; and an adhesive layer erosion prevention coating layer provided to cover an exposed surface of the adhesive layer, which has no pores or cracks since the adhesive layer erosion prevention coating layer is formed in a method of spraying and coating ceramic powder, a constant amount of which is continuously supplied to a carrier gas controlled to flow at a fixed rate, under a condition of 0 to 50° C. in a vacuum state.

At this point, the adhesive layer erosion prevention coating layer is directly coated on the exposed surface of the adhesive layer.

In addition, the adhesive layer erosion prevention coating layer is coated on a covering of the exposed surface of the adhesive layer.

In addition, the base substrate is formed of a metal, a polymer, or a ceramic.

In addition, the adsorption unit is formed of a ceramic sheet or an insulating resin sheet.

In addition, the adhesive layer is formed of an adhesive including thermoplastic resin or thermosetting resin.

In addition, the adhesive layer erosion prevention coating layer is a ceramic coating layer formed of one or more of $Y_2O_3$, $YF_3$, $Al_2O_3$, AlN, SiC, $TiO_2$ and YAG.

In addition, the electrostatic chuck further includes an adsorption unit erosion prevention coating layer formed not to have pores and cracks by spraying and coating ceramic powder, a constant amount of which is continuously supplied to a carrier gas controlled to flow at a fixed rate, on an exposed surface of the adsorption unit under a condition of 0 to 50° C. in a vacuum state. In this case, the adsorption unit erosion prevention coating layer is a ceramic coating layer formed of one or more of $Y_2O_3$, $YF_3$, $Al_2O_3$, AN, SiC, $TiO_2$ and YAG.

On the other hand, according to another aspect of the present invention, there is provided a method of manufacturing an electrostatic chuck, the method including the steps of: (a) forming an adhesive layer for adhering an adsorption unit adsorbing a wafer to a base substrate using electrostatic force, and (b) forming an adhesive layer erosion prevention coating layer covering an exposed surface of the adhesive layer and having no pores or cracks in a method of continuously supplying a constant amount of ceramic powder to a carrier gas controlled to flow at a fixed rate and spraying and coating the ceramic powder under a condition of 0 to 50° C. in a vacuum state.

At this point, step (b) forms the adhesive layer erosion prevention coating layer in a method of directly spraying and coating the ceramic powder on the exposed surface of the adhesive layer.

In addition, step (b) has a covering to wrap the exposed surface of the adhesive layer and forms the adhesive layer erosion prevention coating layer on the surface of the covering.

In addition, a supply amount of the ceramic powder is 0.1 to 100 g/min, and its deviation is smaller than ±1 wt %.

In addition, the ceramic powder is supplied in an environment maintaining an atmospheric pressure state.

A flow amount of the carrier gas is 5 to 500 m³/min, and its deviation is smaller than ±1 vol %.

In addition, step (b) is performed to include the step of forming an adsorption unit erosion prevention coating layer having no pores and cracks by spraying ceramic powder, a constant amount of which is continuously supplied to a carrier gas controlled to flow at a fixed rate, on an exposed surface of the adsorption unit under a condition of 0 to 50° C. in a vacuum state.

Advantageous Effects

The electrostatic chuck according to the present invention and a method of manufacturing the same have the effects described below.

1. An erosion prevention coating layer without having a separation phenomenon can be provided on an exposed surface of an adhesive layer, which adheres an adsorption unit adsorbing and fixing a wafer to a base substrate.

2. A phenomenon of eroding the exposed surface of the adhesive layer by plasma and generating particles can be prevented.

3. A bending phenomenon of a wafer generated by the difference of temperature between the center and the outer periphery of the adsorption unit can be prevented.

4. The lifespan of the electrostatic chuck can be extended.

5. A processing yield can be improved in the process of manufacturing a semiconductor, a display, an LED, or the like which uses an electrostatic chuck.

BEST MODE FOR CARRYING OUT THE INVENTION

The best mode for carrying out the present invention is as described below.

1. Electrostatic Chuck

The electrostatic chuck includes a base substrate formed of a metal, a polymer or a ceramic, an adsorption unit formed of a ceramic sheet or an insulating resin sheet to adsorb a wafer using electrostatic force, an adhesive layer formed of an adhesive including thermoplastic resin or thermosetting resin to adhere the adsorption unit to the base substrate, and an adhesive layer erosion prevention coating layer provided to cover an exposed surface of the adhesive layer, and the adhesive layer erosion prevention coating layer has no pores or cracks since the adhesive layer erosion prevention coating layer is formed in a method of spraying and coating ceramic powder, a constant amount of which is continuously supplied to a carrier gas controlled to flow at a fixed rate, under a condition of 0 to 50° C. in a vacuum state. The adhesive layer erosion prevention coating layer is a ceramic coating layer formed of one or more of $Y_2O_3$, $YF_3$, $Al_2O_3$, AN, SiC, $TiO_2$ and YAG directly coated on the exposed surface of the adhesive layer.

2. Method of Manufacturing an Electrostatic Chuck

A method of manufacturing an electrostatic chuck includes the steps of (a) forming an adhesive layer for adhering an adsorption unit adsorbing a wafer to a base substrate using electrostatic force, and (b) forming an adhesive layer erosion prevention coating layer covering an exposed surface of the adhesive layer and having no pores or cracks in a method of continuously supplying a constant amount of ceramic powder to a carrier gas controlled to flow at a fixed rate and spraying and coating the ceramic powder under a condition of 0 to 50° C. in a vacuum state, and step (b) forms the adhesive layer erosion prevention coating layer in a method of directly spraying and coating the ceramic powder on the exposed surface of the adhesive layer. The supply amount of the ceramic powder is 0.1 to 100 g/min, and its deviation is smaller than ±1 wt %, and the ceramic powder is supplied in an environment maintaining an atmospheric pressure state. The flow amount of the carrier gas is 5 to 500 m³/min, and its deviation is smaller than ±1 vol %.

Hereinafter, an electrostatic chuck according to the present invention and a method of manufacturing the same will be described in detail with reference to the accompanying drawings.

1. Electrostatic Chuck

Figure 1:
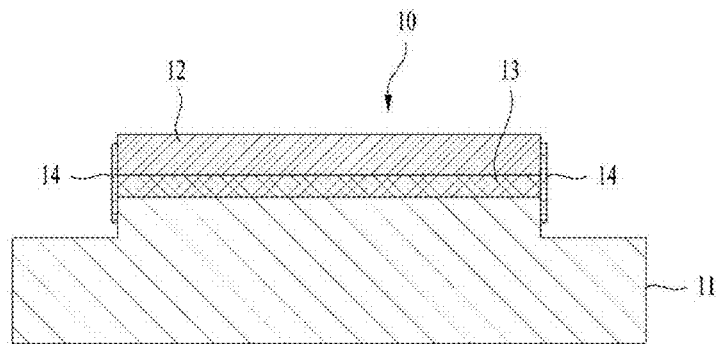
FIG. 1 is a cross-sectional mimetic view showing an electrostatic chuck according to the present invention.

As shown in FIG. 1, an electrostatic chuck 10 according to the present invention includes a base substrate 11, an adsorption unit 12 for adsorbing a wafer, an adhesive layer 13 for adhering the adsorption unit 12 to the base substrate 11, and an adhesive layer erosion prevention coating layer 14 provided to cover an exposed surface of the adhesive layer 13.

The adhesive layer erosion prevention coating layer 14 may be formed by directly coating ceramic powder on an exposed surface of the adhesive layer or coating the ceramic powder on a covering of the exposed surface of the adhesive layer 13. At this point, a material forming the covering may be a metal, a ceramic, a polymer, or the like.

The base substrate 11 is formed of a metal such as aluminum, a polymer such as polyimide, a ceramic such as $Al_2O_3$, or the like. When the base substrate 11 is formed of a metal, an anodizing process can be performed so that arcing may not occur, or an atmospheric plasma spray process can be performed together with the anodizing process.

Figure 2:
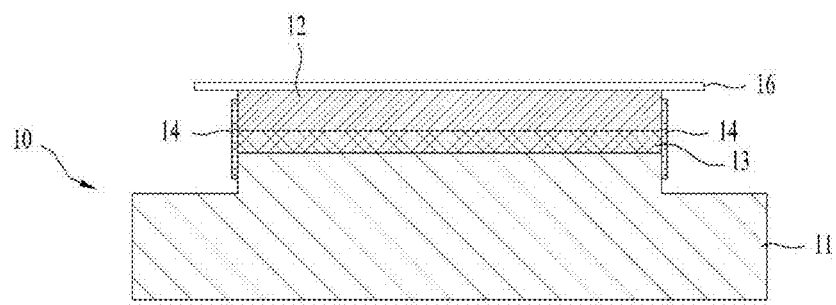
FIG. 2 is a cross-sectional mimetic view showing a state of a wafer adsorbed to an adsorption unit of the electrostatic chuck of FIG. 1.

The adsorption unit 12 is a component for adsorbing and fixing a wafer 16 as shown in FIG. 2, which can be composed of a ceramic sheet or an insulating resin sheet formed of a ceramic functioning as a dielectric material such as $Y_2O_3$, $YF_3$, $Al_2O_3$, AN, SiC, $TiO_2$, YAG or the like or a composite ceramic mixing two or more of the ceramics and may include an electrode to which a voltage for adsorbing the wafer 16 is applied. Other than these, the adsorption unit 12 may include a plurality of holes for flowing cooling gas and protruded embossings contacting with the wafer 16.

The adhesive layer 13 is a component for adhering the adsorption unit 12 to the base substrate 11. The adhesive layer 13 is formed of an adhesive including thermoplastic resin or thermosetting resin and may be obtained by additionally performing heat treatment after adhesion.

The adhesive layer erosion prevention coating layer 14 is formed on an exposed surface of the adhesive layer 13 to perform a function of protecting the exposed surface of the adhesive layer 13 from plasma erosion. Accordingly, the adhesive layer erosion prevention coating layer 14 should cover the adhesive layer 13 formed of resin without pores and cracks and should have plasma resistance.

If erosion of the adhesive layer 13 is progressed during a semiconductor manufacturing process, a difference of temperature occurs between the center and the outer periphery and a wafer bending phenomenon is induced as a result. In addition, the adhesive material of the eroded adhesive layer 13 is created as particles of impurities. Therefore, a means for preventing erosion of the adhesive layer 13 is required, and a specific erosion prevention means should take into account such factors as a degree of exposure to plasma during the process, a temperature, a resin material of the adhesive layer, contraction/expansion/crack of the adhesive layer, a surface state of the adhesive layer, hardness of the adhesive layer and the like. However, since there has been no way to solve those problems of the adhesive layer of electrostatic chuck as described above, a method of removing an eroded adhesive layer and forming a new adhesive layer is generally used. However, such a means invites a problem of increasing cost due to non-periodical or periodical reproduction and does not solve the problem of particles generated by separated adhesive materials.

As described above, the adhesive layer erosion prevention coating layer 14 should cover the adhesive layer 13 formed of resin without pores and cracks and have plasma resistance. However, a coating method using mixed resin of a general binder and a ceramic cannot be applied because it cannot perform an erosion prevention function since the adhesive layer is exposed to high temperature and plasma during the process.

On the other hand, it is very difficult to form a coating layer in an electrostatic chuck by spraying and coating ceramic powder on resin, which is a constituent material of the adhesive layer 13, since the surface of the resin is relatively softer than a metal or ceramic substrate. Accordingly, conditions such as the size, specific gravity, spraying speed and the like of the powder should be properly associated, and an appropriate coating method and material should be selected according to the type of the resin configuring the adhesive layer 13 and various factors described above. In addition, it is suitable that the adhesive layer erosion prevention coating layer 14 is formed to have the thickness of 3 to 10 μm.

As a result of considering these factors, in the present invention, the adhesive layer erosion prevention coating layer 14 is formed in a method of forming an erosion prevention coating layer on an exposed surface of an adhesive layer of a three-dimensional shape by spraying ceramic powder on the exposed surface of the adhesive layer 13 under a condition of 0 to 50° C. in a vacuum state so that the coating layer may not be separated from the exposed surface of the adhesive. Hereinafter, a coating method for forming the adhesive layer erosion prevention coating layer 14 will be described in detail.

Figure 3:
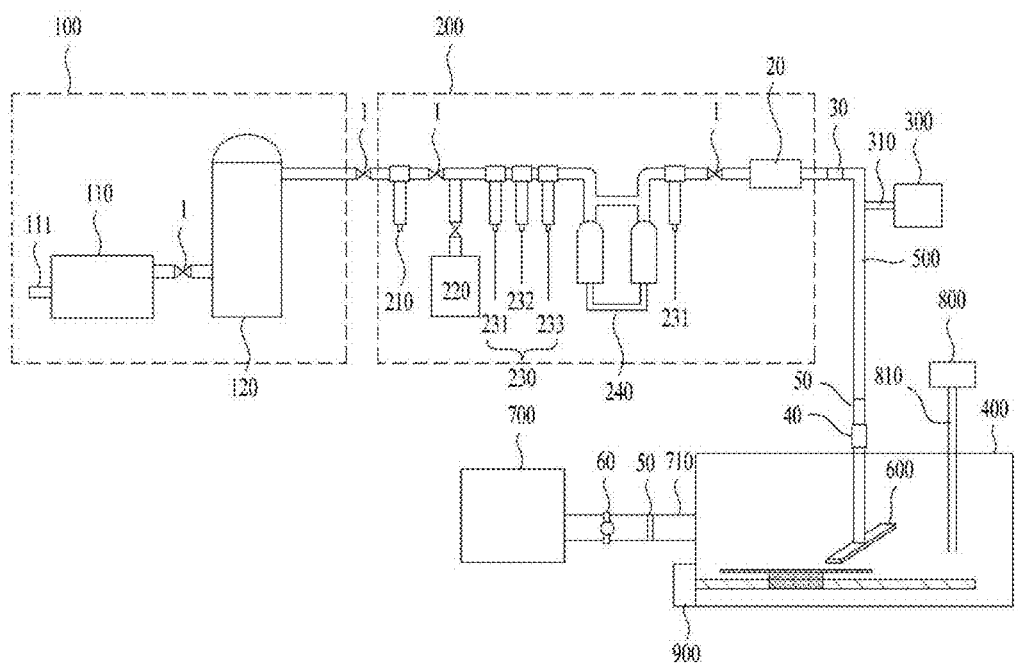
FIGS. 3 and 4 are conceptual views showing a ceramic spray coating apparatus for forming an adhesive layer erosion prevention coating layer of an electrostatic chuck according to the present invention.

The adhesive layer erosion prevention coating layer 14 may be formed in a continuous coating method by the following (a) to (d) processes implemented through a solid powder coating apparatus shown in FIG. 3.

(a) A process of suctioning and storing air.

(b) A process of filtering and drying the suctioned air and transferring a constant amount of the air.

(c) A process of supplying and continuously transferring a constant amount of ceramic powder to the air passing through process (b) and in a state of being controlled to flow at a fixed rate.

(d) A process of spraying the ceramic powder passing through process (c) on a substrate placed inside a coating chamber having a condition of 0 to 50° C. and a vacuum state through a slit nozzle.

The reference numerals shown in FIG. 3 are as described below.

1: Flow control valve, 20: Flow rate controller, 30: Flow controller, 40: Length control device, 50: Pressure meter, 60: Pressure control valve, 100: Air supply unit, 110: Air pump, 111: Air inlet, 120: Air storage tank, 200: Air processing unit, 210: First filter, 220: First dryer, 230: Second filter, 231: Moisture filter, 232: Oil filter, 233: Dust filter, 240: Second dryer, 300: Solid powder supply unit, 310: Connection tube, 400: Coating chamber, 500: Transfer tube, 600: Slit nozzle, 700: Vacuum pump, 710: Vacuum connection tube, 800: Exhaustion pump, 810: Exhaustion tube 900: Transfer device.

Specifically, the ceramic powder may be formed of one or more of $Y_2O_3$, $YF_3$, $Al_2O_3$, AN, SiC, $TiO_2$, and YAG. In addition, the solid powder coating apparatus shown in FIG. 3 for implementing the process described above basically includes: an air supply unit 100 including an air pump 110 for pumping air suctioned through an air inlet 111 and an air storage tank 120 for cooling down and storing the pumped air, an air processing unit 200 for filtering, drying and exhausting the air provided from the air supply unit 100, a solid powder supply unit 300 for supplying a constant amount of ceramic powder to the air exhausted through the air processing unit 200, a coating chamber 400 provided with a substrate inside thereof, a transfer tube 500 functioning as a tube for connecting the air processing unit 200 and the coating chamber 400 to transfer the powder mixed with the air exhausted from the air processing unit 200 to the coating chamber 400, a slit nozzle 600 provided at an end of the transfer tube 500 to spray the mixed air on the substrate provided inside the coating chamber 400, and a vacuum pump 700 connected to the coating chamber 400 through a vacuum connection tube 710 to maintain a vacuum state of the coating chamber 400, and the solid powder coating apparatus further includes an exhaustion pump 800 for forcibly exhausting the solid powder remaining inside the coating chamber 400 through an exhaustion tube 810, and a transfer device 900 for transferring the substrate.

Details of a method and a device for forming the adhesive layer erosion prevention coating layer 14 of the electrostatic chuck 10 according to the present invention can be referenced from Korean Patent Registration No. 10-0916944 entitled "Continuous solid powder vapour-deposition device, and a continuous solid powder vapour deposition method" (PCT/KR2009/04041; US 2011/0104369, US 2013/0149471 "Apparatus and Method for Continuous Powder Coating").

Figure 4:
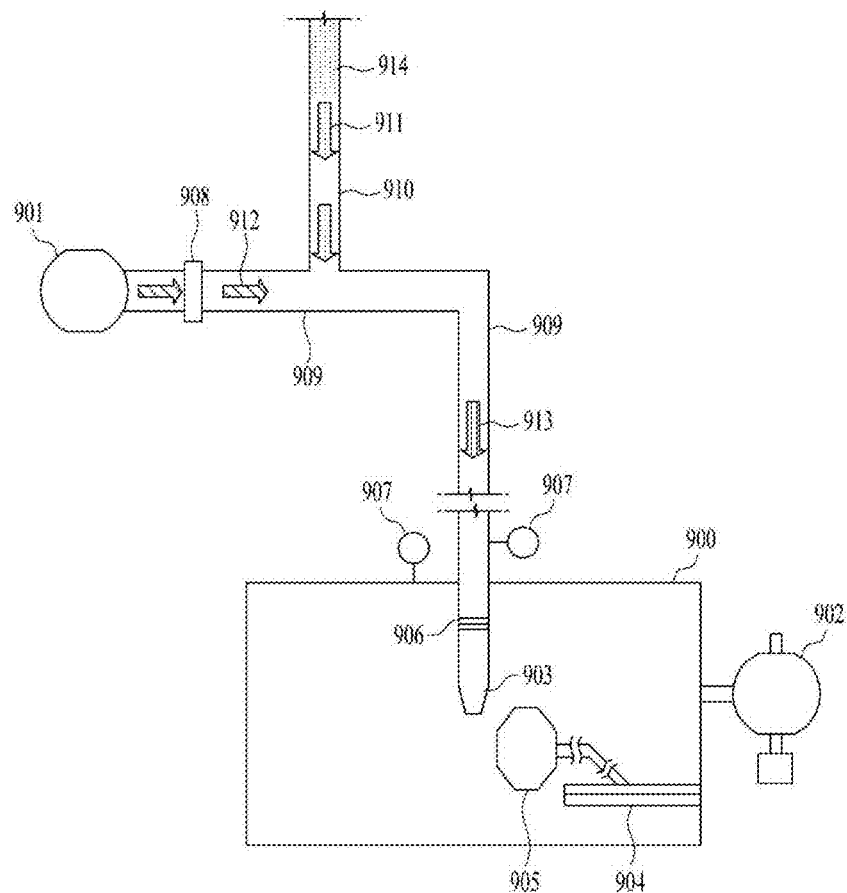

In addition, as shown in FIG. 4, a solid powder coating apparatus includes a transfer tube 910 for providing a transfer path of solid powder 914, a gas supply tube 909 functioning as a path of the gas supplied from a gas supply device 901, a spray nozzle 903 combined at one end of the transfer tube 910 or the gas supply tube 909, a coating chamber 903 containing the spray nozzle 903, a solid powder supply unit (not shown) for supplying the solid powder 914 sucked from an environment maintaining an atmospheric pressure state to the transfer tube 910, and a pressure control device 902 for controlling internal pressure of the coating chamber 900, and it is configured to suck the gas of an atmospheric pressure state into the transfer tube 910 by negative pressure of the coating chamber 900 formed by driving the pressure control device 902, and the suction gas 911 and the supply gas 912 act together as carrier gas 913 of the solid powder 914.

When the solid powder coating apparatus of FIG. 4 is used, the adhesive layer erosion prevention coating layer 14 can be formed in a solid powder coating method, in which negative pressure is generated inside the coating chamber 14 so that the carrier gas 913 mixing the suction gas 911 suctioned into the transfer tube 910 and the supply gas 912 provided from the gas supply device 901 to the gas supply tube 909 may transfer the solid powder 914 flowing into the transfer tube 910 in an environment maintaining an atmospheric pressure state to spray the solid powder through the spray nozzle 903, and thus the sprayed solid powder 914 is coated on the substrate arranged inside the coating chamber 900 of a vacuum state.

The solid powder coating apparatus shown in FIG. 4 and a solid powder coating method using the device are described in detail in Korean Patent Application No. 10-2013-0081638 entitled "Solid powder coating apparatus and method" and Korean Patent Application No. 10-2014-0069017 entitled "Solid powder coating apparatus and method" (PCT/KR2014/006217).

Figure 5:
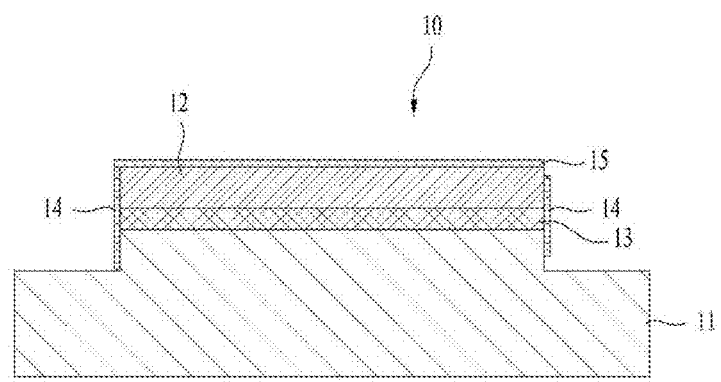
FIG. 5 is a cross-sectional mimetic view showing an embodiment in which an adsorption unit erosion prevention coating layer is additionally formed on an electrostatic chuck according to the present invention.

Meanwhile, the electrostatic chuck 10 according to the present invention further includes an adsorption unit erosion prevention coating layer 15 formed on the adsorption unit 12 as shown in FIG. 5. The coating material and method of the adsorption unit erosion prevention coating layer 15 are the same as those described above in relation to the adhesive layer erosion prevention coating layer 14. Ceramic powder formed of one or more of $Y_2O_3$, $YF_3$, $Al_2O_3$, AN, SiC, $TiO_2$, and YAG can be used as a coating material, and a method of spraying and coating the ceramic powder, a constant amount of which is continuously supplied to a carrier gas controlled to flow at a fixed rate, on an exposed surface of the adsorption unit under a condition of 0 to 50° C. in a vacuum state can be used as the coating method, and thus a coating layer having no pores and cracks is formed on the exposed surface of the adsorption unit 12 of a three-dimensional shape so that the coating layer may not be separated from the exposed surface of the adsorption unit 12 (particularly, a separation phenomenon generating around the holes of the adsorption unit of the electrostatic chuck, around the protruded embossings, and at the edges of the adsorption unit in the conventional method does not occur in the electrostatic chuck according to the present invention).

Figure 6:
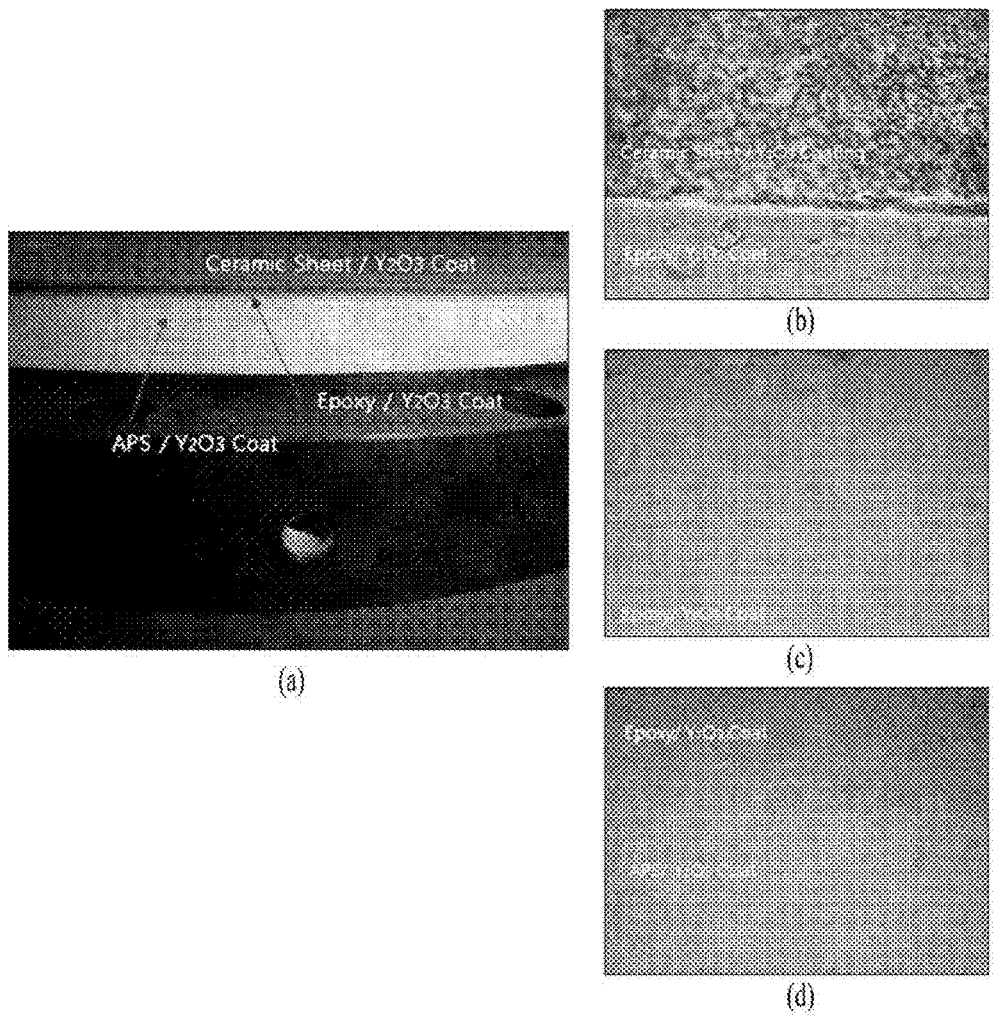
FIG. 6 shows a picture (a) of an electrostatic chuck, among the electrostatic chucks according to the present invention, including a base atmospherically plasma-sprayed on an anodized aluminum substrate, an adsorption unit formed of a ceramic sheet, an adhesive layer formed of epoxy resin and an adhesive layer erosion prevention coating layer, and optical microscopic pictures (b, c and d) around the adhesive layer erosion prevention coating layer.
Figure 7:
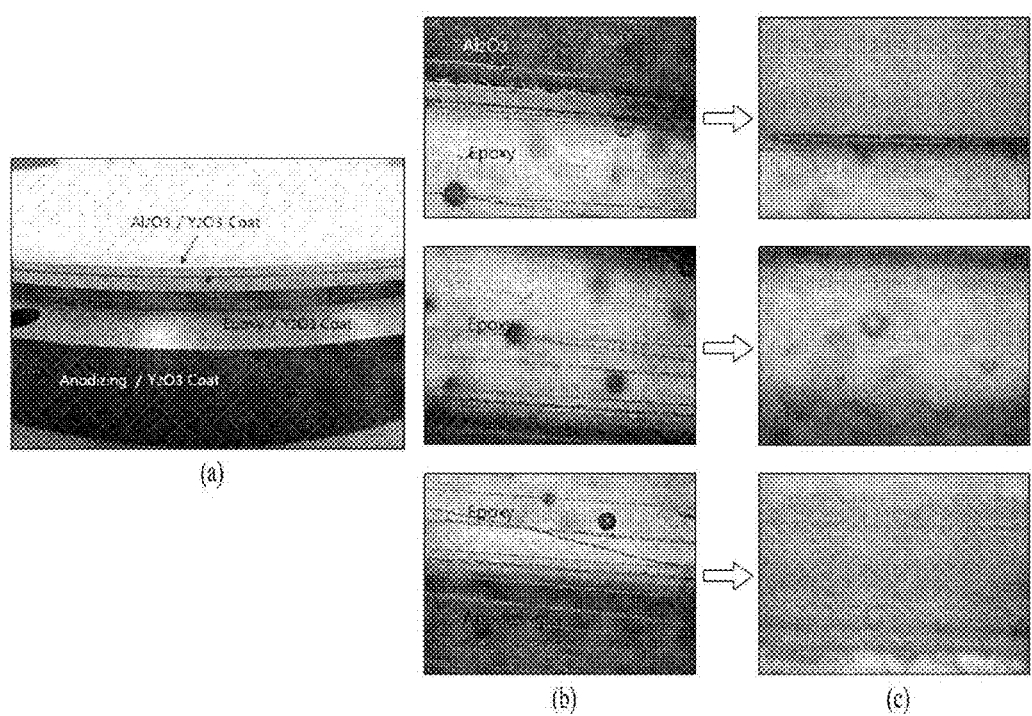
FIG. 7 shows a picture (a) of an electrostatic chuck, among the electrostatic chucks according to the present invention, including a base formed of an anodized aluminum substrate, an adsorption unit formed of an $Al_2O_3$ ceramic sheet, an adhesive layer formed of epoxy resin and an adhesive layer erosion prevention coating layer, an optical microscopic picture (b) around the adhesive layer before the adhesive layer erosion prevention coating layer is formed, and an optical microscopic picture (c) around the adhesive layer after the adhesive layer erosion prevention coating layer is formed.

A specific embodiment of the electrostatic chuck 10 according to the present invention can be confirmed through FIGS. 6 and 7.

FIG. 6 shows a picture (a) of an electrostatic chuck, among the electrostatic chucks according to the present invention, including a base atmospherically plasma-sprayed on an anodized aluminum substrate, an adsorption unit formed of a ceramic sheet, an adhesive layer formed of epoxy resin and an adhesive layer erosion prevention coating layer, and optical microscopic pictures (b, c and d) around the adhesive layer erosion prevention coating layer, and FIG. 7 shows a picture (a) of an electrostatic chuck, among the electrostatic chucks according to the present invention, including a base formed of an anodized aluminum substrate, an adsorption unit formed of an $Al_2O_3$ ceramic sheet, an adhesive layer formed of epoxy resin and an adhesive layer erosion prevention coating layer, an optical microscopic picture (b) around the adhesive layer before the adhesive layer erosion prevention coating layer is formed, and an optical microscopic picture (c) around the adhesive layer after the adhesive layer erosion prevention coating layer is formed.

It can be confirmed from FIGS. 6 (*b*) and (*c*) that part of the side surface of the adsorption unit formed of a ceramic sheet and the adhesive layer formed of epoxy resin are covered with a $Y_2O_3$ ceramic layer, and it can be confirmed from FIG. 6 (*d*) that the adhesive layer formed of epoxy resin and part of the thermal spray coating layer are covered with a $Y_2O_3$ ceramic layer.

It can be confirmed from FIG. 7 (*c*) that the side surface of the adsorption unit formed of an $Al_2O_3$ ceramic sheet and the adhesive layer formed of epoxy resin are covered with an $Y_2O_3$ ceramic layer.

2. Method of Manufacturing Electrostatic Chuck

A method of manufacturing an electrostatic chuck according to the present invention includes the steps of (a) forming an adhesive layer 13 for adhering an adsorption unit 12 adsorbing a wafer to a base substrate 11 using electrostatic force, and (b) forming an adhesive layer erosion prevention coating layer 14 covering an exposed surface of the adhesive layer and having no pores or cracks in a method of continuously supplying a constant amount of ceramic powder to a carrier gas controlled to flow at a fixed rate and spraying and coating the ceramic powder under a condition of 0 to 50° C. in a vacuum state.

Step (a) is a step of forming the adhesive layer 13 by adhering and fixing the adsorption unit 12 of the electrostatic chuck to the base substrate 11. In this step, the adsorption unit 12 and the base substrate 11 are combined with each other, and an exposed surface of the adhesive layer 13 is generated. The exposed surface of the adhesive layer 13 may be formed in a variety of shapes such as a circular shape, a rectangular shape, and the like.

Step (b) is performed in a method of forming the adhesive layer erosion prevention coating layer 14 by directly spraying and coating the ceramic powder on the exposed surface of the adhesive layer 13, and, in addition, the step combines a covering to wrap the exposed surface of the adhesive layer 13 and forms the adhesive layer erosion prevention coating layer 14 on the outer surface of the covering.

Meanwhile, step (b) is performed to include the step of forming an adsorption unit erosion prevention coating layer 15 having no pores and cracks by spraying ceramic powder, a constant amount of which is continuously supplied to a carrier gas controlled to flow at a fixed rate, on an exposed surface of the adsorption unit under a condition of 0 to 50° C. in a vacuum state.

Meanwhile, the supply amount of the ceramic powder is 0.1 to 100 g/min, and its deviation is smaller than ±1 wt %, and, in addition, the ceramic powder is supplied in an environment maintaining an atmospheric pressure state. The flow amount of the carrier gas is 5 to 500 $m^3$/min, and its deviation is smaller than ±1 vol %.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

INDUSTRIAL APPLICABILITY

An electrostatic chuck is a device for adsorbing and fixing a wafer in a semiconductor manufacturing process, which is used in the process of deposition, etching, diffusion, or the like. The present invention relates to such an electrostatic chuck and a method of manufacturing the same, and more specifically, to an electrostatic chuck and a method of manufacturing the same, in which the electrostatic chuck is configured to include an adhesive layer erosion prevention coating layer for preventing erosion of an adhesive layer which adheres an adsorption unit performing a function of fixing a wafer to the base substrate of the electrostatic chuck.

The invention claimed is:

1. An electrostatic chuck comprising:
   a base substrate;
   an adsorption unit for adsorbing a wafer using electrostatic force;
   an adhesive layer for adhering the adsorption unit to the base substrate; and
   an adhesive layer erosion prevention coating layer provided to cover an exposed surface of the adhesive layer,
   wherein the adhesive layer erosion prevention coating layer is formed in a method of continuously supplying a constant amount of ceramic powder to a carrier gas controlled to flow at a fixed rate, and spraying and coating the ceramic powder on the exposed surface of the adhesive layer under a condition of 0 to 50° C. in a vacuum state, wherein the ceramic powder is supplied in an environment maintaining an atmospheric pressure state.

2. The chuck according to claim 1, wherein the adhesive layer erosion prevention coating layer is directly coated on the exposed surface of the adhesive layer.

3. The chuck according to claim 1, wherein the adhesive layer erosion prevention coating layer is coated on an outer surface of a covering wrapping and combined with the exposed surface of the adhesive layer.

4. The chuck according to claim 1, wherein the base substrate is formed of a metal, a polymer or a ceramic.

5. The chuck according to claim 1, wherein the adsorption unit is formed of a ceramic sheet or an insulating resin sheet.

6. The chuck according to claim 1, wherein the adhesive layer is formed of an adhesive including thermoplastic resin or thermosetting resin.

7. The chuck according to claim 1, wherein the adhesive layer erosion prevention coating layer is a ceramic coating layer formed of one or more of $Y_2O_3$, $YF_3$, $Al_2O_3$, AlN, SiC, $TiO_2$, and YAG.

8. The chuck according to claim 1, further comprising an adsorption unit erosion prevention coating layer formed by spraying and coating ceramic powder, wherein a constant amount of the ceramic powder is continuously supplied to a carrier gas, which is controlled to flow at a fixed rate, to be coated on an exposed surface of the adsorption unit under a condition of 0 to 50° C. in a vacuum state.

9. The chuck according to claim 8, wherein the adsorption unit erosion prevention coating layer is a ceramic coating layer formed of one or more of $Y_2O_3$, $YF_3$, $Al_2O_3$, AlN, SiC, $TiO_2$, and YAG.

10. A method of manufacturing an electrostatic chuck, the method comprising the steps of:
    (a) preparing an adsorption unit for adsorbing a wafer using electrostatic force and disposing an adhesive layer for adhering the adsorption unit to a base substrate, and
    (b) providing an adhesive layer erosion prevention coating layer covering an exposed surface of the adhesive layer in a method of continuously supplying a constant amount of ceramic powder to a carrier gas controlled to flow at a fixed rate, and spraying and coating the ceramic powder on the exposed surface of the adhesive layer under a condition of 0 to 50° C. in a vacuum state, wherein the ceramic powder is supplied in an environment maintaining an atmospheric pressure state.

11. The method according to claim 10, wherein in the step (b), the adhesive layer erosion prevention coating layer is formed in a method of directly spraying and coating the ceramic powder on the exposed surface of the adhesive layer.

12. The method according to claim 10, wherein the step (b) comprises preparing a covering to wrap the exposed surface of the adhesive layer and disposing the adhesive layer erosion prevention coating layer on an outer surface of the covering.

13. The method according to claim 10, wherein a supply amount of the ceramic powder is 0.1 to 100 g/min, and its deviation is smaller than ±1 wt %.

14. The method according to claim 10, wherein a flow amount of the carrier gas is 5 to 500 m³/min, and its deviation is smaller than ±1 vol %.

15. The method according to claim 10, further comprising the step of forming an adsorption unit erosion prevention coating layer by continuously supplying a constant amount of the ceramic powder to a carrier gas controlled to flow at a fixed rate, and spraying and coating the ceramic powder on an exposed surface of the adsorption unit under a condition of 0 to 50° C. in a vacuum state.

* * * * *